(12) United States Patent
Shibuya et al.

(10) Patent No.: US 11,942,384 B2
(45) Date of Patent: Mar. 26, 2024

(54) SEMICONDUCTOR PACKAGE HAVING AN INTERDIGITATED MOLD ARRANGEMENT

(71) Applicant: Texas Instruments Incorporated, Dallas, TX (US)

(72) Inventors: Makoto Shibuya, Beppu (JP); Masamitsu Matsuura, Beppu (JP); Kengo Aoya, Beppu (JP); Hideaki Matsunaga, Beppu (JP); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 77 days.

(21) Appl. No.: 17/515,234

(22) Filed: Oct. 29, 2021

(65) Prior Publication Data

US 2023/0137762 A1    May 4, 2023

(51) Int. Cl.
*H01L 23/31*      (2006.01)
*H01L 23/00*      (2006.01)
*H01L 23/495*     (2006.01)

(52) U.S. Cl.
CPC ...... *H01L 23/3107* (2013.01); *H01L 23/4952* (2013.01); *H01L 24/16* (2013.01); *H01L 24/48* (2013.01); *H01L 2224/16245* (2013.01); *H01L 2224/48245* (2013.01)

(58) Field of Classification Search
CPC .. H01L 23/3107; H01L 23/4952; H01L 24/16
See application file for complete search history.

(56) References Cited

U.S. PATENT DOCUMENTS

| 5,600,178 A | 2/1997 | Russell |
| 2021/0398882 A1* | 12/2021 | Thompson ........ H01L 23/49838 |
| 2022/0157682 A1* | 5/2022 | Fuergut ............. H01L 23/49555 |

* cited by examiner

*Primary Examiner* — Errol V Fernandes
(74) *Attorney, Agent, or Firm* — Ronald O. Neerings; Frank D. Cimino

(57) ABSTRACT

A semiconductor package including a leadframe has a plurality of leads, and a semiconductor die including bond pads attached to the leadframe with the bond pads electrically coupled to the plurality of leads. The semiconductor die includes a substrate having a semiconductor surface including circuitry having nodes coupled to the bond pads. A mold compound encapsulates the semiconductor die. The mold compound is interdigitated having alternating extended mold regions over the plurality of leads and recessed mold regions in between adjacent ones of the plurality of leads.

22 Claims, 6 Drawing Sheets

SEMICONDUCTOR PACKAGE HAVING AN INTERDIGITATED MOLD ARRANGEMENT

FIELD

This Disclosure relates to semiconductor packaging, and more particularly to leadframe and mold compound shape design.

BACKGROUND

A variety of semiconductor packages are known that provide support for an integrated circuit (IC) die or other semiconductor die and associated bond wires, provide protection from the environment, and enable surface mounting of the die to and interconnection generally to a printed circuit board (PCB). One conventional package configuration includes a leadframe having a die pad and wire bond pads connected to leads.

Leadframe semiconductor packages are well known and widely used in the electronics industry to house, mount, and interconnect a variety of ICs. A conventional leadframe is typically die-stamped from a sheet of flat-stock metal, and includes a plurality of metal leads temporarily held together in a planar arrangement about a central region during package manufacture by a rectangular frame comprising a plurality of expendable "dam-bars." A mounting pad for a semiconductor die is supported in the central region by "tie-bars" that attach to the frame. The leads extend from a first end integral with the frame to an opposite second end adjacent to, but spaced apart from, the die pad.

In a flipchip on leadframe package arrangement, (also called a flipchip on leadframe (FCOL)), a bumped die having solder bumps on the bond pads on its top side surface is mounted onto a leadframe, where the die is bonded to the wire bond pads of the leads through re-flowing of the solder bump. Flipchip assembly technology is widely utilized in semiconductor packaging due to its short interconnect paths between the flip-chip die and a substrate, which eliminates the space needed for wire bonding and thus reduces the overall size of the package. In addition, the elimination of wire bonds reduces undesired parasitic inductance, thereby making this package configuration attractive for high-frequency applications.

Plastic semiconductor packages typically include a mold compound for encapsulating the semiconductor die(s). The mold compound is generally shaped by top and bottom mold plates that have associated mold cavities of the molding apparatus to have smooth sides, including a smooth top and smooth bottom side, and smooth sides between the top side and the bottom side. The bottom mold cavity is conventionally taller (or thicker) as compared to the top mold cavity in certain relatively small sized semiconductor packages, such as, for example, a small outline transistor (SOT, such as SOT-23) package and a closely related SC-70 package. SC-70 has only a smaller footprint as compared to SOT-23.

The leads for the leaded semiconductor package may comprise gull-wing leads which first extend a short distance out from the mold of the semiconductor package, then extend in a downward direction, and then again extend out from the semiconductor package. Gull-wing leads have the advantage of a relatively large area in contact with the solder generally used for mounting the semiconductor package, and they also function as mechanical springs thus improving reliability of the semiconductor package. Gull-wing leads are commonly used on surface mount semiconductor packages, such as a quad flat pack (QFP) package and a small outline integrated circuits (SOIC) package.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize there is a need for a lower-cost-leaded semiconductor package, beyond the reduced cost provided by what is termed herein an interdigitated lead frame (IDLF), particularly for relatively low-cost leaded packages including SOT, small outline package (SOP), and SOIC packages. An IDLF improves the leadframe density on a leadframe sheet (or panel) by having leads for adjacent leadframe units be interdigitated. This is accomplished by designing leadframes so that the center position for leads is offset by a one-half lead pitch distance on opposing sides of the leadframe units. This allows the leads of adjacent units to be side-by side rather than end-to end, and this provides sufficient room for interdigitating leads to implement and IDLF for the leadframe units.

Disclosed aspects start with an IDLF and implement further package unit cost-reduction by providing an interdigitated mold arrangement which reduces the lead length for providing a leadframe sheet with a higher package unit density. The higher unit density provides more package units in a given area of a sheet (or panel) of packaged devices, that generally maintains the same individual package unit area dimensions (footprint) as a conventional semiconductor package without a disclosed interdigitated mold arrangement. The reduced lead length provided enables a reduced spacing between adjacent package units while also generally not tightening a given lead spacing requirement. The disclosed interdigitated mold arrangement is defined herein as alternating extended mold regions positioned over and lateral to the leads of a leadframe, and recessed mold regions located between adjacent leads. For disclosed aspects the leads can be straight leads, or the leads can be bent leads, such as being gull-wing leads.

Disclosed aspects include a semiconductor package comprising a leadframe including a plurality of leads and a semiconductor die including bond pads attached to the leadframe with the bond pads electrically coupled to the plurality of leads. The semiconductor die comprises a substrate having a semiconductor surface including circuitry having nodes coupled to the bond pads. A mold compound encapsulates the semiconductor die that is interdigitated comprising alternating extended mold regions over the plurality of leads and recessed mold regions located between adjacent ones of the leads.

BRIEF DESCRIPTION OF THE DRAWINGS

Reference will now be made to the accompanying drawings, which are not necessarily drawn to scale.

FIG. 3C is a see-through perspective view of an example SOT package including wirebonds, that has a mold arrangement with an inverted mold height configuration comprising a taller top mold portion as compared to the bottom mold portion. FIG. 3D shows a see-through perspective view of an example SOT package configured as a flipchip package that has a mold arrangement with a mold height allocation figuration configured to have a taller top mold portion as compared to the bottom mold portion. FIG. 3E is a side view of the SOT package or SOT package more clearly showing its inverted mold height allocation figuration comprising a taller top mold portion as compared to the height of the bottom mold portion.

DETAILED DESCRIPTION

Figure 1A:
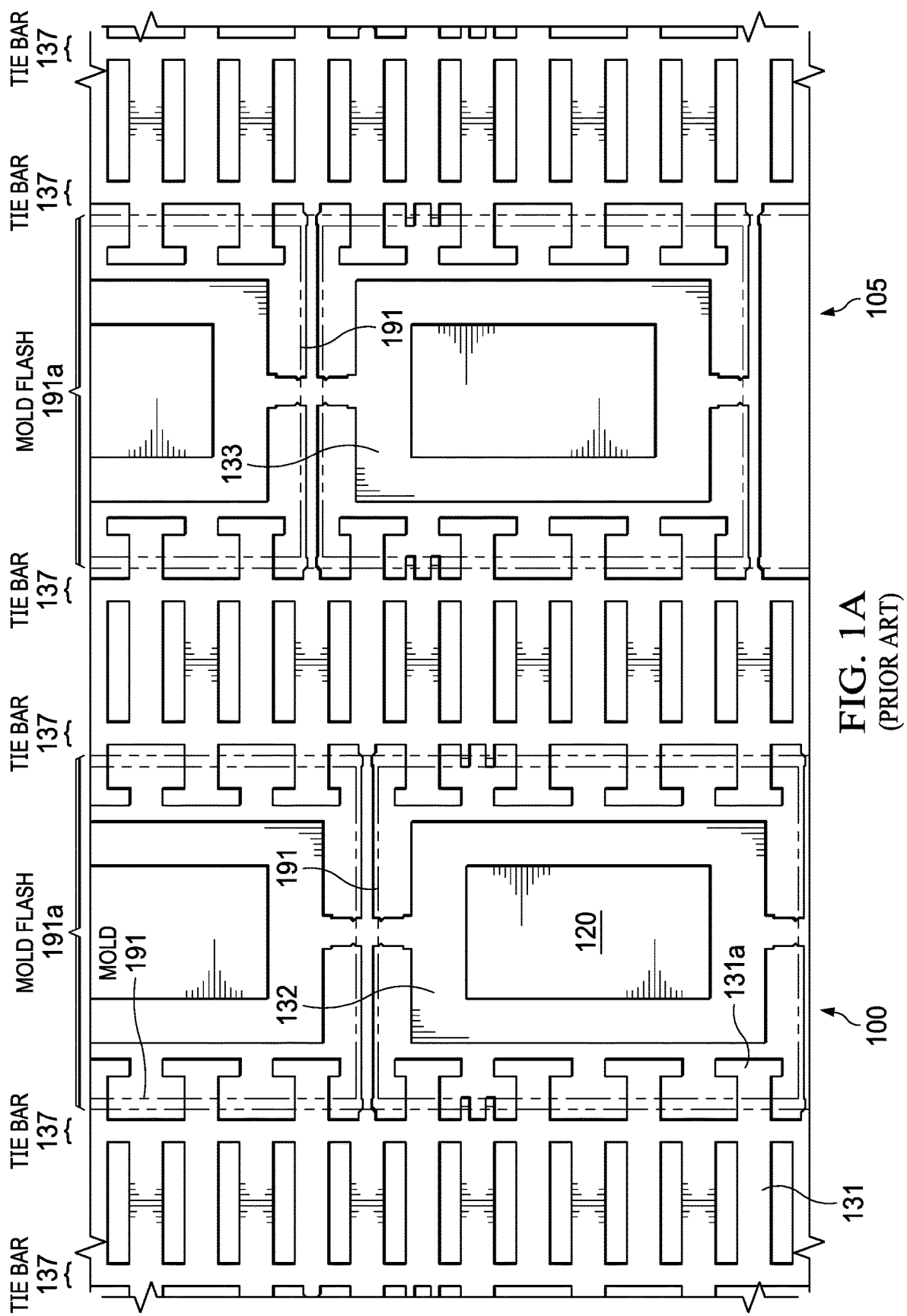
FIG. 1A shows a top view of a portion of a sheet of conventional SOIC packages with one entire SOIC package shown that reveals a semiconductor die on the die pad and the inner portions of the leads that would ordinarily not be visible mold compound, and a second entire SOIC package shown on a die pad. The sheet can be seen to have an IDLF arrangement. The leads are shown as gull-wing leads in FIG. 1B which shows a cross-sectional view of a single unit of the conventional SOIC package shown in FIG. 1A.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

FIG. 1A shows a top view of a portion of a sheet of conventional SOIC packages with one entire SOIC package shown as 100 that reveals a semiconductor die 120 on the die pad 132 and the inner portions of the leads 131a that would ordinarily not be visible due to the mold compound 191, and a second entire SOIC package shown as 105 on a die pad 133. Portions of the mold compound 191 are identified as mold flash areas 191a that include framing around the mold compound 191. In the mold flash areas 191a the mold compound 191 is the same thickness as the other portions of the mold compound, and the mold flash areas 191a will occur in all spaces outside the mold cavity where there is no leadframe.

Figure 1B:
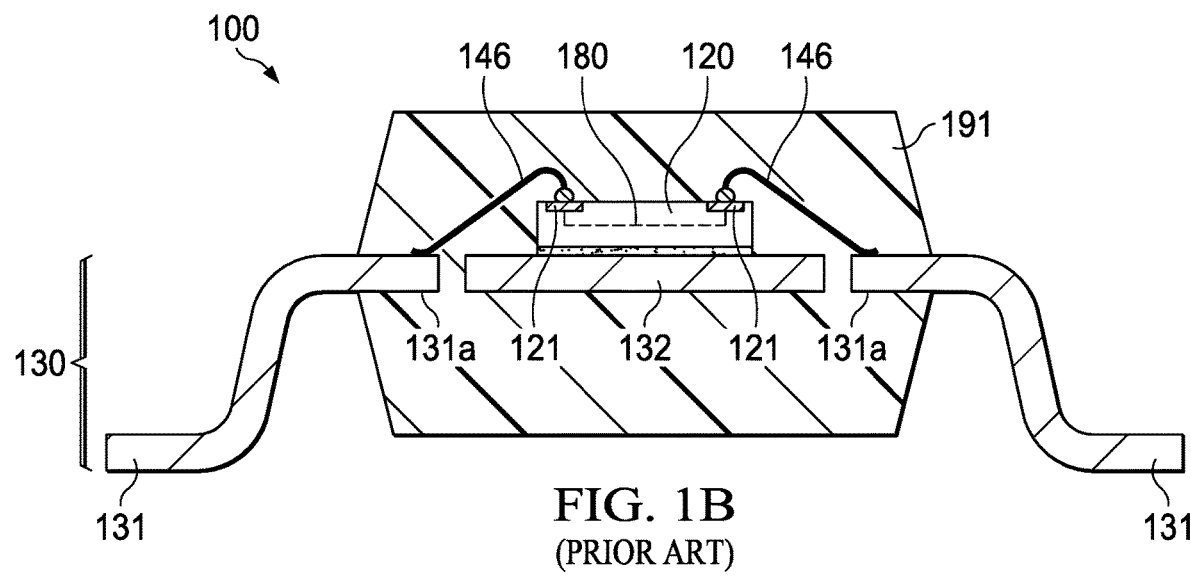

Both the mold compound 191 and the mold flash areas 191a have their boundaries shown by dashed lines defining rectangles. The leadframes of the sheet can be seen to have an IDLF arrangement. The tie bars are shown as 137, and the leads as 131 including inner lead portions 131a (being within the mold compound 191), where the leads 131 can be gull-wing leads as shown in FIG. 1B described below. The mold compound 191 for the conventional SOIC packages 100, 105 can be seen to have a smooth mold outline shown on all of its sides. The unit-to-unit pitch for the sheet of conventional SOIC packages may be 6.3 mm.

FIG. 1B is a cross-sectional view of a single unit of the conventional SOIC package 100 shown in FIG. 1A showing a semiconductor die 120 mounted top side up on the die pad 132, the semiconductor die 120 including circuitry 180 electrically connected to bond pads 121. The circuitry 180 on the semiconductor die 120 comprises circuit elements (including transistors, and generally diodes, resistors, capacitors, etc.) that may be formed in the epitaxial layer on a bulk substrate material such as silicon, where the circuit elements are configured together for generally realizing at least one circuit function. Example circuit functions include transistor, analog (e.g., amplifier or power converter), radio frequency (RF), digital, or non-volatile memory functions. The bond pads 121 are wirebonded by bond wires 146 to the inner lead portion 131a of the leads 131 of the leadframe shown in FIG. 1B as 130. The leads 131 are shown as being gull-wing leads.

Figure 2A:
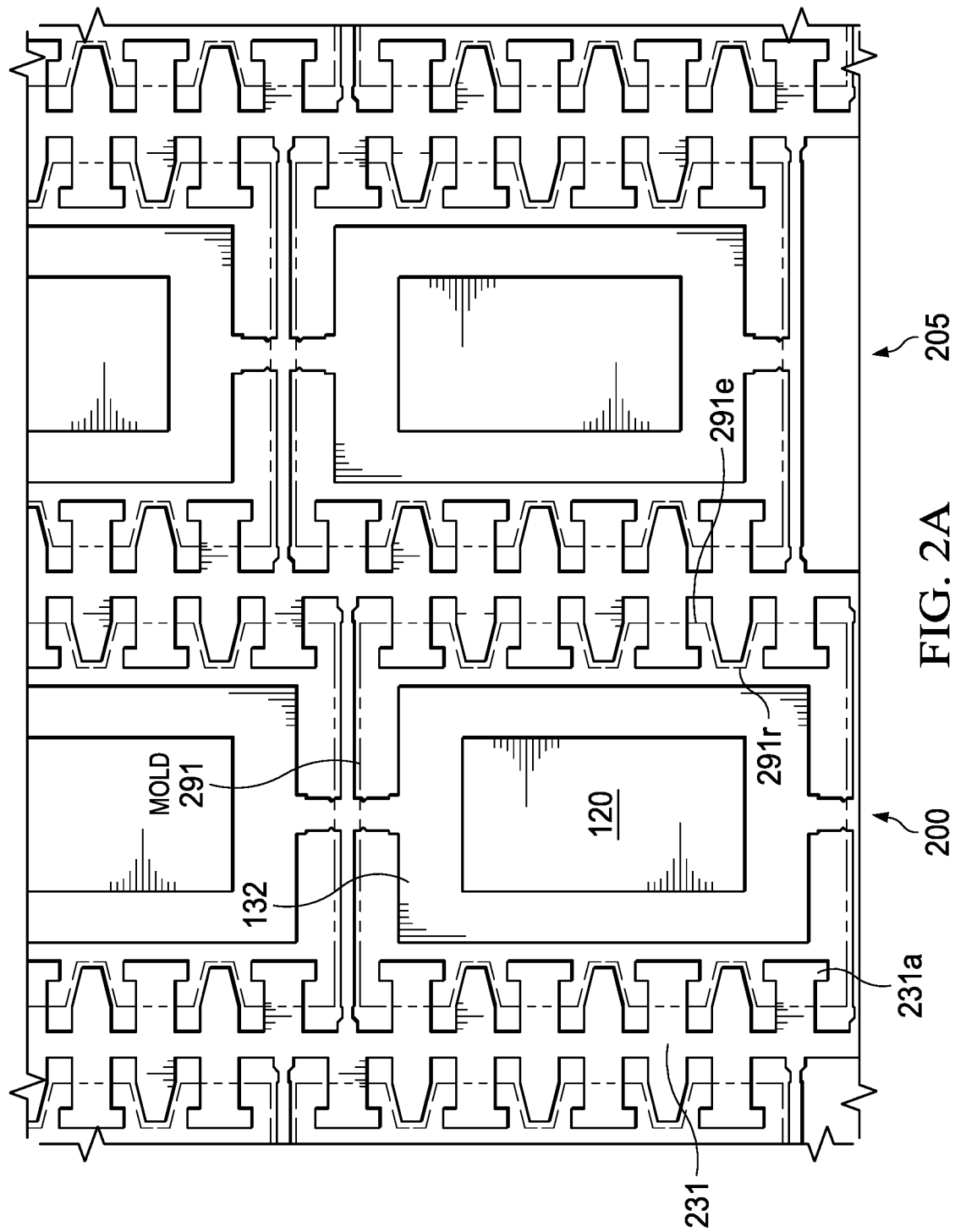
FIG. 2A shows a top view of a portion of a sheet example SOIC packages with one entire SOIC package shown as that reveals a semiconductor die on the die pads of the leads which are shown as straight leads, where the inner portions would ordinarily not be visible due to the mold compound. The mold arrangement for the mold compound is interdigitated which can be seen to comprise alternating extended mold regions positioned over and lateral to the leads of the leadframe, and recessed mold regions located in between the leads.

FIG. 2A shows a top view of a portion of a sheet example SOIC packages with one entire SOIC package shown as 200 that reveals a semiconductor die 120 on the die pad 132 and the inner lead portions 231a of the leads 231 shown as straight leads, where the inner portions 231a would ordinarily not be visible due to the mold arrangement 291 that interdigitated sides. There is also an entire second SOIC package shown as 205. The semiconductor package can also comprise a Small-Outline Transistor (SOT) package, or a Plastic Small Outline Package (SOP). The interdigitated aspect of the mold compound arrangement (mold arrangement) 291 can be seen to comprise alternating extended mold regions shown as 291e positioned over and lateral to the leads 231 of the leadframe, and recessed mold regions 291r located in between the leads 231. A distance the extended mold regions 291e extend beyond the recessed mold regions 291r can be between 0.2 mm and 1 mm.

The unit-to-unit pitch for the sheet example SOIC packages shown in FIG. 2A is 4.66 mm, which is reduced relative to the unit-to-unit pitch for the conventional sheet of SOIC packages shown in FIG. 1A. The leadframes can be seen to lack any tie bars that are shown above in FIG. 1A as tie bars 137.

Figure 2B:
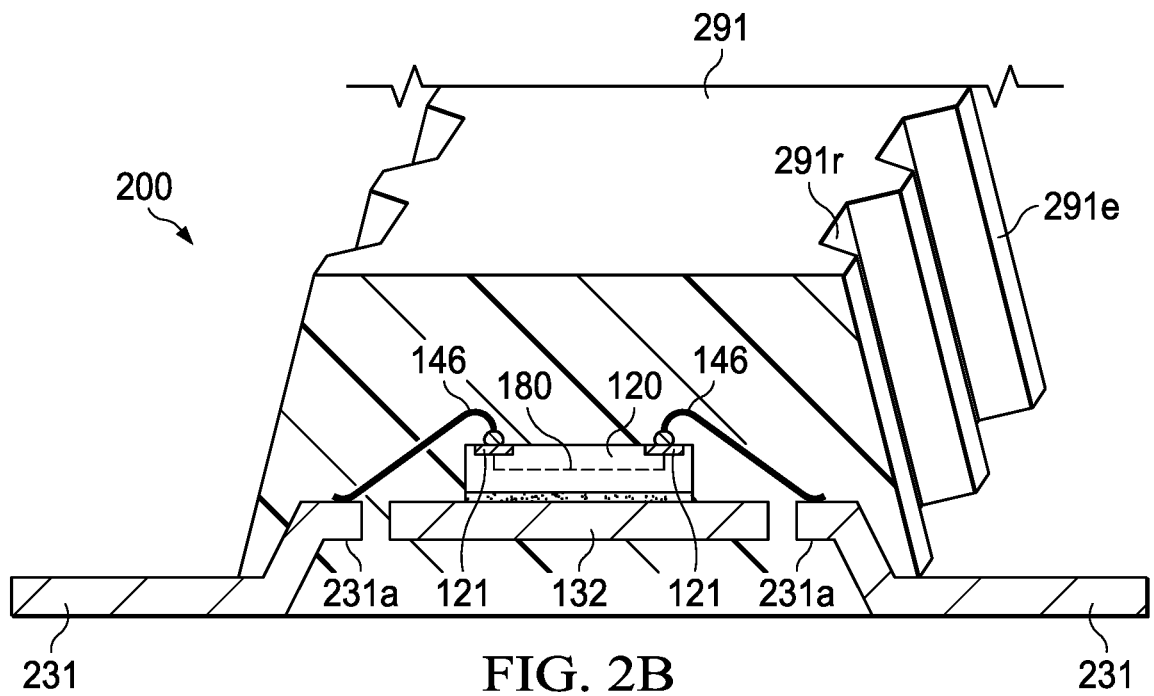
FIG. 2B is a cross-sectional view of a single unit of the SOIC package shown as a wirebond package including straight leads and an interdigitated mold arrangement as shown in FIG. 2A which includes extended mold regions and recessed mold regions that is represented in a simplified fashion with a sidewall portion depiction.
Figure 2C:
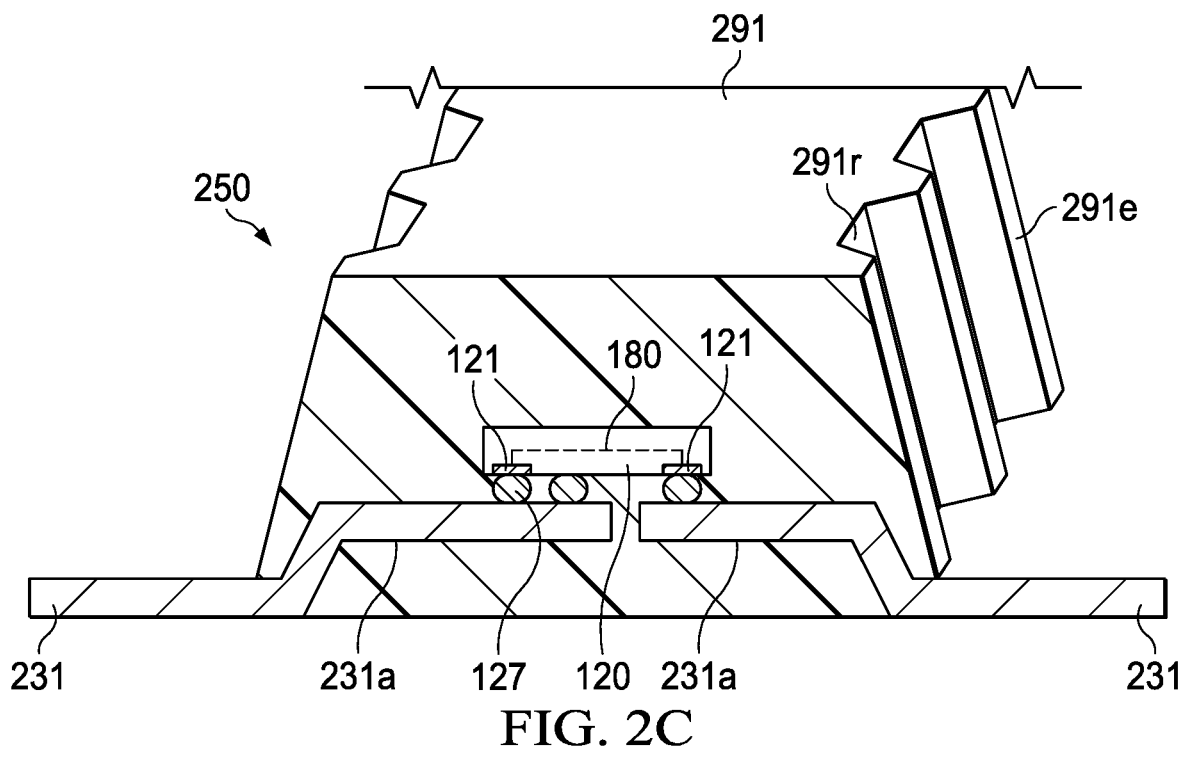
FIG. 2C is a cross-sectional view of a single unit of a SOIC package shown as a flipchip package including straight leads, having the interdigitated mold arrangement shown in FIG. 2A shown in the same simplified fashion as in FIG. 2B, but now the mold arrangement is also showing a disclosed inverted mold figuration that includes a taller top mold portion shown and a shorter bottom mold portion shown as entirely being a top mold portion. The leads as shown are nearly straight leads throughout (including the inner portion).

Disclosed aspects also include redesigning a conventional semiconductor package having gull-wing leads, such as the conventional SOIC package 100 having a conventional mold arrangement having all planar sides with gullwing leads, into a disclosed semiconductor package having an interdigitated mold arrangement and non-gullwing leads resulting in an increase in package unit density, while again enabling keeping the same package footprint and lead spacing. FIG. 2B and FIG. 2C described below demonstrates this disclosed redesign. The location of the top of disclosed leads may also be at a position that is lower as compared to the conventional semiconductor package 100 before its conversion by employing a feature known as inverted mold arrangement that is described below. This package conversion by combining non-gullwing leads (for example, straight leads) along with an interdigitated mold compound has been found to provide a 33% higher packaged unit density for the sheet.

FIG. 2B is a cross-sectional view of a single unit of the SOIC package shown as a wirebond package 200 including straight leads 231 and a mold arrangement 291 that includes interdigitated sides, as shown in FIG. 2A, comprising extended mold regions 291e and recessed mold regions 291r depicted in a simplified fashion by showing a portion of a sidewall of the SOIC package 200. The SOIC package 200 is also shown including a semiconductor die 120 including circuitry 180 connected to bond pads 121 attached top side up to a die pad 132, where the bond pads 121 are wirebonded by bond wires 146 to the inner lead portions 231a of the leads 231 of the leadframe. FIG. 2B also shows the mold arrangement 291 further including an inverted mold arrangement in the height direction as entirely being a top mold portion, that can be implemented using a molding apparatus having only a top mold cavity, but not a bottom mold cavity. However, the inverted mold arrangement can also utilize both a top mold cavity and a bottom mold cavity configured to provide a top mold portion that is taller by at least 50% as compared to a bottom mold portion.

FIG. 2C is a cross-sectional view of a single unit of a SOIC package shown as a flipchip package 250 including straight leads 231 having the mold arrangement 291 including interdigitated sides comprising extended mold regions 291e, and recessed mold regions 291r shown in FIG. 2A and in FIG. 2B (and a simplified fashion) depicted again in a simplified fashion by showing a portion of the sidewall of the SOIC package. FIG. 2C also again shows the mold arrangement 291 the mold arrangement as entirely being a top mold. The outer portion of the leads 231 as shown are nearly straight leads throughout. Also shown is a semiconductor die 120 having its bond pads 121 with solder thereon 127 flipchip mounted onto the inner lead portions 231a of the leads 231 of the leadframe.

Figure 3E:
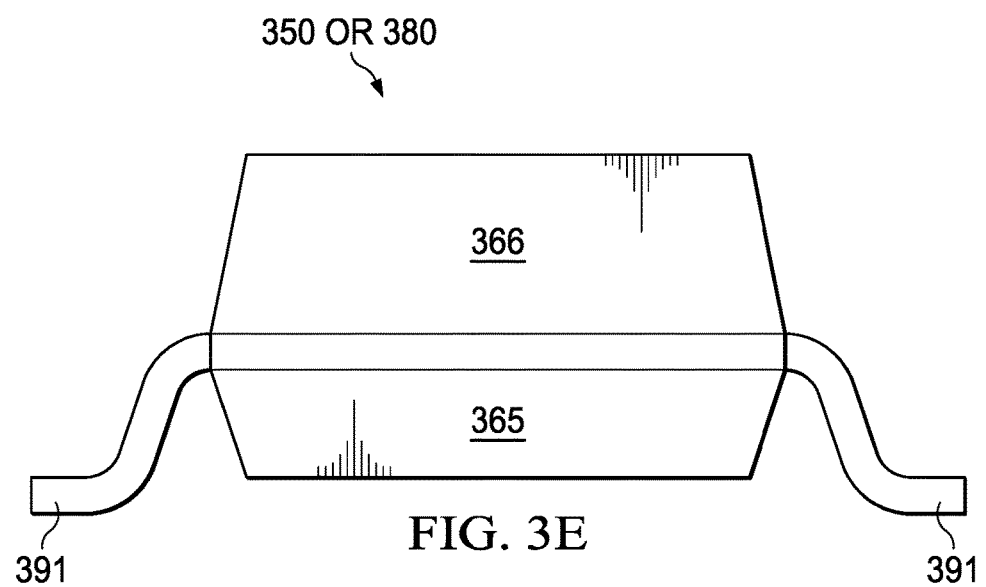
FIGS. 3C-3E show SOT packages having a mold arrangement comprising an inverted mold height allocation configuration. The leads can be seen to be shorter in length as compared to the leads shown above relative to the conventional SOT package shown in FIG. 3A.
Figure 3A:
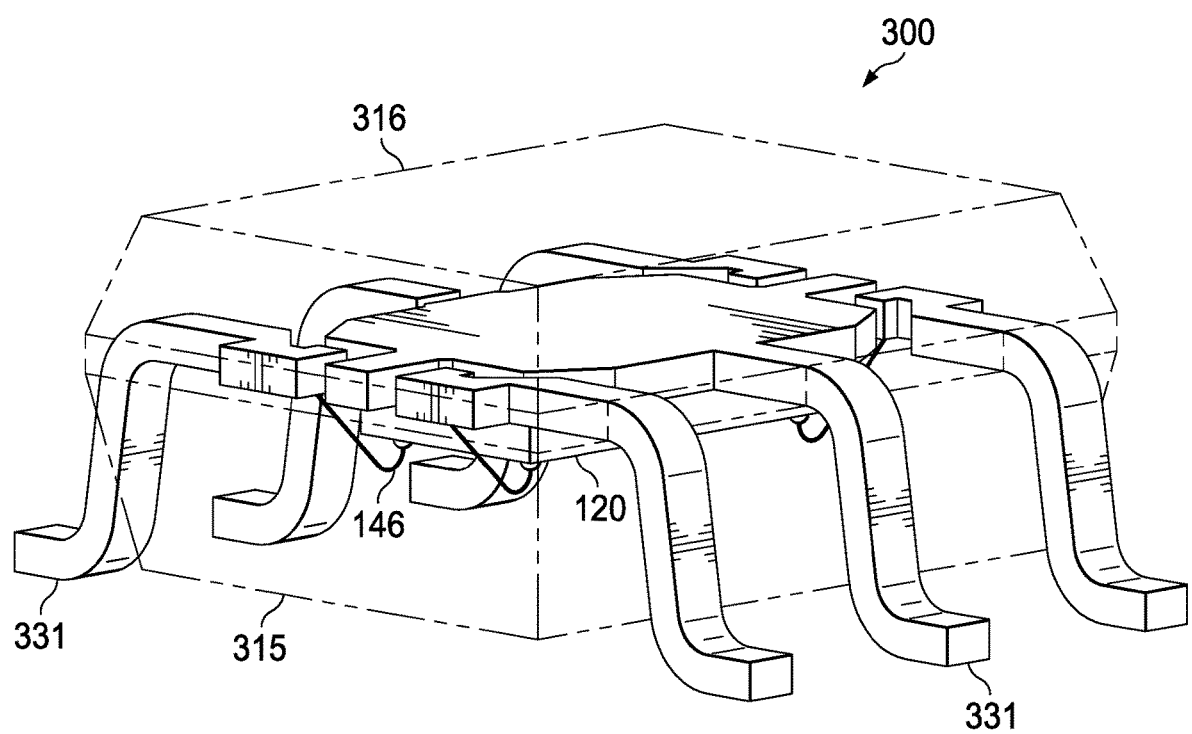
FIG. 3A shows a see-through perspective view of a conventional SOT package that has a conventional mold height allocation configuration having a taller bottom mold portion as compared to the height of the top mold portion.
Figure 3B:
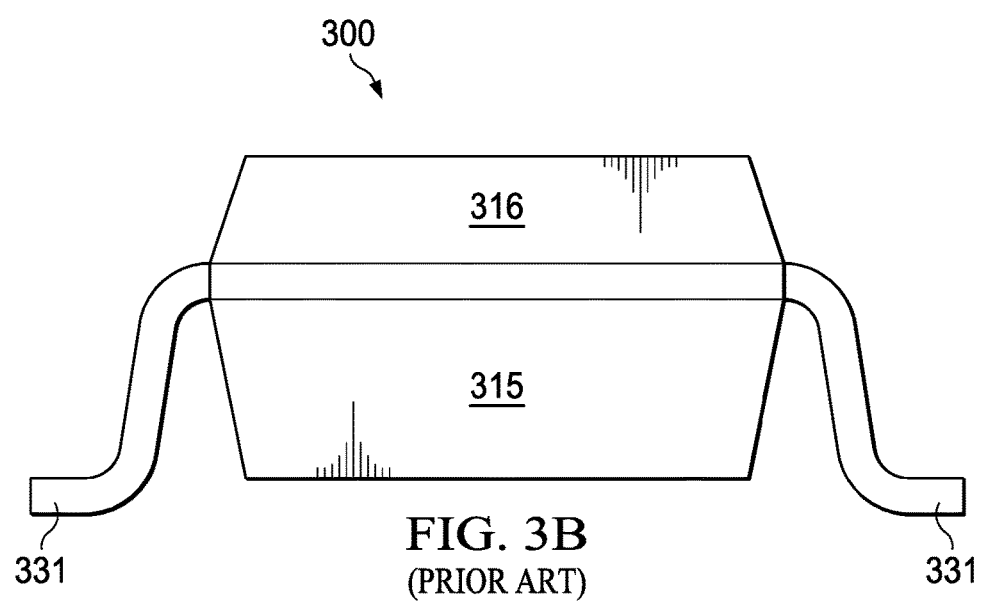
FIG. 3B is a side view of the SOT package more clearly showing its taller bottom mold portion as compared to the height of the top mold portion.

FIG. 3A shows a see-through perspective view of a conventional SOT package 300 that has a conventional mold height allocation arrangement having a taller bottom mold portion 315 as compared to the top mold portion 316. Also shown is a semiconductor die 120 including circuitry 180 connected to bond pads 121 (not shown) flipchip mounted onto the leads 331 of the leadframe. FIG. 3B is a side view of the SOT package 300 more clearly showing its taller bottom mold portion 315 as compared to the height of the top mold portion 316.

Another disclosed aspect comprises an inverted mold arrangement defined herein as the top mold portion being taller as compared to the height of the bottom mold portion, described above relative to FIGS. 2B and 2C. This disclosed aspect can be applied to SOT packages, such as SOT-23, and SC-70. This aspect can also be applied to packages having a tall bottom mold cavity and shorter (less tall) top mold cavity. However, SOIC and most of SOP generally have a symmetric mold cavity depth design. An asymmetric mold cavity design that have the bottom mold portion taller than the top mold portion often occur with relatively tiny packages such as SOT-23 and SC70. The reason to have the bottom mold portion taller than the top mold portion is to enable the bottom mold portion to have allocated enough space for the die bond and bondwires, or a flipchip ball bond on/above the leadframes.

The disclosed inverted mold design reduces the lead length which provides for higher unit density. The combination of the IDLF and inverted mold was found to achieve a significantly higher unit density design for SOT and similar semiconductor packages, such as a density improvement of between 30% and 50%.

Figure 3C:
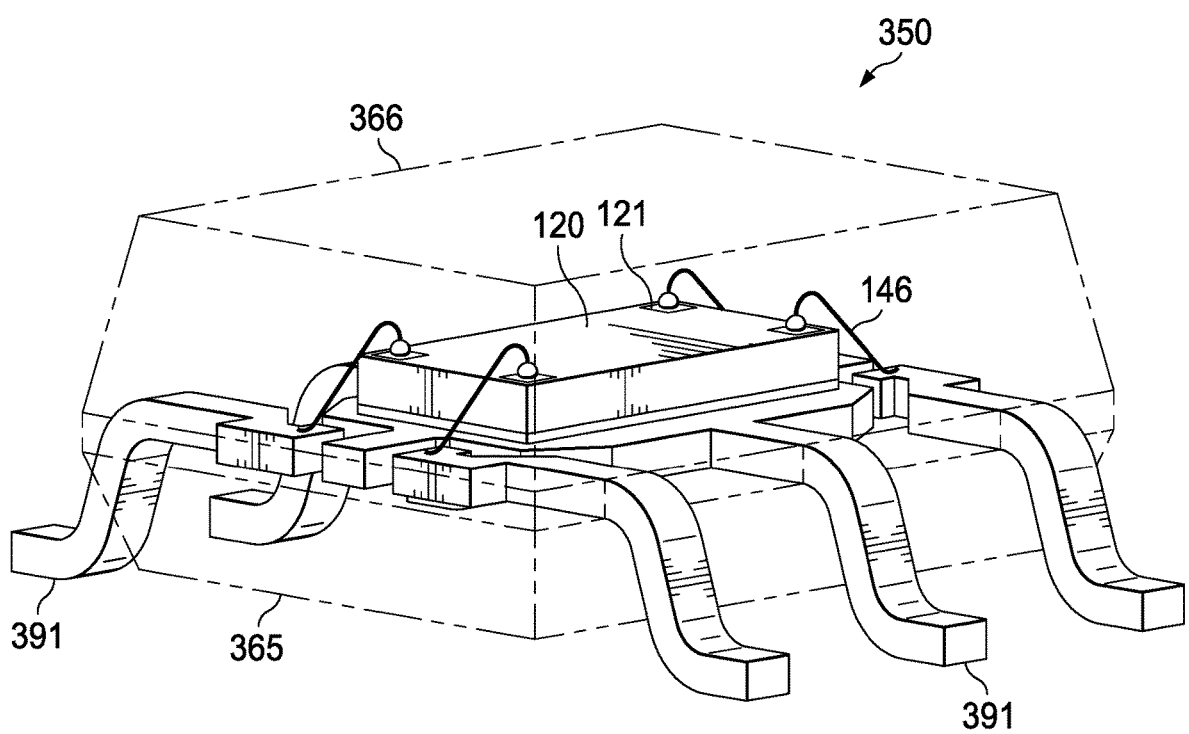
Figure 3D:
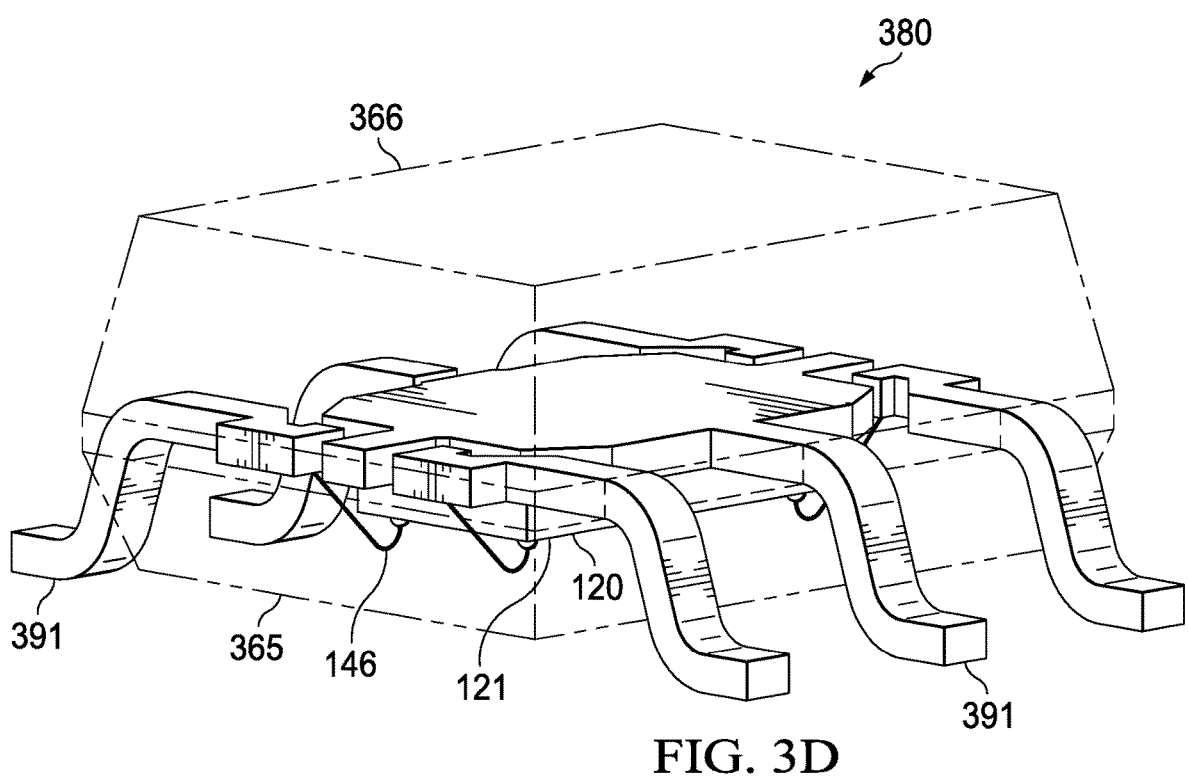

FIGS. 3C-3E show SOT packages having an inverted mold height allocation arrangement. The leads are now shown as 391 that can be seen to be shorter in length as compared to the leads 331 shown above relative to the known SOT package 300 shown in FIG. 3A. FIG. 3C is a see-through perspective view of an example SOT package 350 including wirebonds 146 that has the mold arrangement comprising an inverted mold height allocation arrangement comprising a taller top mold portion 366 as compared to the bottom mold portion 365. Also shown is a semiconductor die 120 including circuitry 180 connected to bond pads 121 that are wirebonded by the wirebonds 146 to the leads 391.

FIG. 3D shows a see-through perspective view of an example SOT package 380 configured as a flipchip package that has a mold arrangement comprising an inverted mold height allocation comprising a taller top mold portion 366 as compared to the bottom mold portion 365. Also shown is a semiconductor die 120 including circuitry 180 connected to bond pads 121 that are flipchip mounted onto the leads 391 of the leadframe. FIG. 3E is a side view of the SOT package 350 or SOT package 380 that more clearly showing its inverted mold height allocation mold arrangement comprising a taller top mold portion 366 as compared to the height of the bottom mold portion 365.

Disclosed aspects apply to both wirebond packages and flipchip packages, and include several advantages over conventional packages. Regarding the disclosed interdigitated mold arrangement, the package outline is changed and can conform to the JEDEC standard footprint. This disclosed interdigitated mold arrangement as described above leads to a higher unit density especially for SOIC packages, because there are spaces to assign the age 13 interdigitated mold body shape to reduce the unit-to-unit pitch. The Interdigitated mold arrangement also has the advantage for increasing the creepage distance which is helpful for high voltage applications. To prevent electrostatic discharge (ESD) damage especially for high voltage applications, there is needed enough lead-to-lead distance. Air is recognized to not be a good material to fill in between leads for preventing ESD. Non-electrically conductive, high volume resistance Mold compound is good to be filled in between lead to lead for preventing ESD. In addition, the interdigitated protrusion shape itself physically extends the lead-to-lead distance where exposed to the outside of the mold body.

Disclosed aspects can be integrated into a variety of assembly flows to form a variety of different semiconductor packages and related products. The semiconductor package can comprise single semiconductor die or multiple semiconductor die, such as configurations comprising a plurality of stacked semiconductor die, or laterally positioned semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A semiconductor package, comprising:
a leadframe including a plurality of leads;
a semiconductor die including bond pads attached to the leadframe with the bond pads electrically coupled to the plurality of leads, the semiconductor die comprising a substrate having a semiconductor surface including circuitry having nodes coupled to the bond pads, and
a mold compound encapsulating the semiconductor die that is interdigitated comprising alternating extended mold regions over the plurality of leads and recessed mold regions in between adjacent ones of the plurality of leads, at least one of the extended mold regions extending from a top surface to a bottom surface of the mold compound.

2. The semiconductor package of claim 1, wherein a distance the extended regions extend beyond the recessed regions is between 0.2 mm and 1 mm.

3. The semiconductor package of claim 1, further comprising bond wires between the bond pads and the plurality of leads.

4. The semiconductor package of claim 1, wherein the bond pads of the semiconductor die are flipchip mounted on the plurality of leads.

5. The semiconductor package of claim 1, wherein the plurality of leads extend out linearly from the mold compound and continue in a straight line for their entire length.

6. The semiconductor package of claim 1, wherein the mold compound is configured as an inverted mold arrangement that comprises a top mold portion that is taller by at least 50% as compared to a bottom mold portion.

7. The semiconductor package of claim 6, wherein the inverted mold arrangement is configured with exclusively a top mold portion.

8. The semiconductor package of claim 1, wherein the semiconductor package comprises a Small-outline transistor (SOT) package, Plastic Small Outline Package (SOP), or a small outline IC (SOIC) package.

9. The semiconductor package of claim 1, wherein the leadframe is exclusive of a tie bar.

10. A method, comprising:
attaching a semiconductor die comprising a substrate having a semiconductor surface including circuitry electrically coupled to bond pads that are electrically coupled to a plurality of leads of a leadframe;
molding with a mold apparatus having a top mold plate and a bottom mold plate configured to provide a mold compound that is interdigitated providing alternating extended mold regions over the plurality of leads and recessed mold regions in between adjacent ones of the plurality of leads, at least one of the extended mold regions extending from a top surface to a bottom surface of the mold compound, and wherein the recessed mold regions are located between adjacent ones of the plurality of leads.

11. The method of claim 10, further comprising after the attaching positioning bond wires between the bond pads and the plurality of leads to provide an electrical coupling.

12. The method of claim 10, wherein a distance the extended regions extend beyond the recessed regions is between 0.2 mm and 1 mm.

13. The method of claim 10, wherein the attaching comprises flipchip attaching the bond pads of the semiconductor die on the plurality of leads.

14. The method of claim 10, wherein the leadframe is part of a leadframe sheet comprising a plurality of the leadframes.

15. The method of claim 10, wherein the plurality of leads extend out linearly from the mold compound and continue in a straight line for their entire length.

16. The method of claim 10, wherein the mold compound is configured as an inverted mold arrangement that comprises a top mold portion that is taller as compared to a bottom mold portion.

17. A semiconductor package, comprising:
a leadframe including a plurality of leads;
a semiconductor die including bond pads attached to the leadframe with the bond pads electrically coupled to the plurality of leads, the semiconductor die comprising a substrate having a semiconductor surface including circuitry having nodes coupled to the bond pads, and
a mold compound encapsulating the semiconductor die that is interdigitated comprising alternating extended mold regions over the plurality of leads and recessed mold regions in between adjacent ones of the plurality of leads,
wherein the mold compound is configured as an inverted mold arrangement that comprises a top mold portion that is taller by at least 50% as compared to a bottom mold portion.

18. The semiconductor package of claim 17, wherein the plurality of leads extend out linearly from the mold compound and continue in a straight line for their entire length.

19. The semiconductor package of claim 17, wherein a distance the extended regions extend beyond the recessed regions is between 0.2 mm and 1 mm.

20. The semiconductor package of claim 17, wherein the inverted mold arrangement is configured with exclusively a top mold portion.

21. A semiconductor package, comprising:
a leadframe including a plurality of leads;
a semiconductor die including bond pads attached to the leadframe with the bond pads electrically coupled to the plurality of leads, the semiconductor die comprising a substrate having a semiconductor surface including circuitry having nodes coupled to the bond pads, and
a mold compound encapsulating the semiconductor die that is interdigitated comprising alternating extended mold regions over the plurality of leads and recessed mold regions in between adjacent ones of the plurality of leads, each extended mold region covering no more than one lead of the plurality of leads.

22. A method, comprising:
attaching a semiconductor die comprising a substrate having a semiconductor surface including circuitry electrically coupled to bond pads that are electrically coupled to a plurality of leads of a leadframe;

molding with a mold apparatus having a top mold plate and a bottom mold plate configured to provide a mold compound that is interdigitated providing alternating extended mold regions over the plurality of leads, each extended mold regions covering one of the leads, and recessed mold regions in between adjacent ones of the plurality of leads, wherein the recessed mold regions are located between adjacent ones of the plurality of leads.

\* \* \* \* \*